United States Patent [19]

Huang et al.

[11] Patent Number: 5,895,254
[45] Date of Patent: Apr. 20, 1999

[54] METHOD OF MANUFACTURING SHALLOW TRENCH ISOLATION STRUCTURE

[75] Inventors: Kuo-Tai Huang, Hsinchu; Tony Lin, Kao Hsiung Hsien; Water Lur, Taipei, all of Taiwan

[73] Assignee: United Microelectronics Corp., Hsin-Chu, Taiwan

[21] Appl. No.: 08/993,500

[22] Filed: Dec. 18, 1997

[30] Foreign Application Priority Data

Oct. 9, 1997 [TW] Taiwan ................ 86114837

[51] Int. Cl.$^6$ ................................ H01L 21/76
[52] U.S. Cl. ................. 438/424; 438/427; 438/435; 148/DIG. 50
[58] Field of Search ........................ 438/429, 427, 438/435; 148/DIG. 50

[56] References Cited

U.S. PATENT DOCUMENTS

| | | | |
|---|---|---|---|
| 5,433,794 | 7/1995 | Fazan et al. | 148/33.3 |
| 5,506,168 | 4/1996 | Morita et al. | 148/DIG. 50 |
| 5,795,811 | 8/1998 | Kim et al. | 438/435 |
| 5,801,082 | 9/1998 | Tseng | 438/424 |

*Primary Examiner*—Trung Dang
*Attorney, Agent, or Firm*—Knobbe, Martens, Olson & Bear LLP

[57] ABSTRACT

A method for forming a shallow trench isolation structure comprising the steps of sequentially forming a pad oxide layer and a mask layer over a substrate, then patterning the mask layer and the pad oxide layer. Next, an opening is formed in the mask layer, wherein the sidewall of the opening in the mask layer forms a sharp angle with the substrate layer below. Thereafter, the substrate is etched from the opening down to form a trench. In a subsequent step, insulating material is deposited into the trench forming an insulating layer rising to a level higher than the mask layer, and accompanying by the formation of a protuberance at the side of the insulating layer. Subsequently, the mask layer is removed, and then portions of the pad oxide layer is removed to form a spacer on the upper side of the insulating layer. Finally, the pad oxide layer above the substrate is removed to complete the formation of the shallow trench isolation structure. Due to the presence of a spacer, resistance against subsequent etching is increased at the junction between the trench insulating layer and the substrate layer. Thus, kink effect caused by the over-etching of the insulating layer is prevented.

15 Claims, 4 Drawing Sheets

METHOD OF MANUFACTURING SHALLOW TRENCH ISOLATION STRUCTURE

BACKGROUND OF THE INVENTION

1. Field of Invention

The present invention relates to a method for manufacturing device isolation structure. More particularly, the present invention relates to a method for manufacturing a shallow trench isolation structure.

2. Description of Related Art

A complete integrated circuit is normally made from tens of thousand of transistor devices. To prevent any short-circuiting between two neighboring devices, an insulating layer must be formed between them. Besides using the LOCOS method, another commonly used device isolating structure is the shallow trench isolation (STI).

FIGS. 1A through 1C are cross-sectional views showing the progression of manufacturing steps in the production of a conventional shallow trench isolation structure. First, as shown in FIG. 1A, a pad oxide layer 11 and a silicon nitride layer 12 are sequentially formed over a substrate 10. Then, using conventional photolithographic and etching processes, the silicon nitride layer 12, the pad oxide layer 11 and the substrate 10 are patterned and etched to form an opening 13 in the substrate 10. The opening 13 serves as a trench for isolation purposes. A liner oxide layer 14 can also be formed on the interior surface of the opening 13. Thereafter, an oxide layer for isolating the devices is deposited over the silicon nitride layer 12 and into the opening 13, then a chemical-mechanical polishing (CMP) operation is performed to planarize the structure. After removing extra oxide from the oxide surface, an oxide layer 15 as shown in FIG. 1B is formed. Finally, the silicon nitride layer 12 and the pad oxide layer 11 are removed, and a complete device isolation structure is obtained as shown in FIG. 1C.

In the aforementioned steps, the pad oxide layer 11 is removed using a wet etching method. The etchant used in the etching is normally hydrofluoric acid solution. Since this is an isotropic etching solution, upper surface of the oxide layer 15 adjacent to the substrate 10 can be over-etched by the hydrofluoric acid. Consequently, recesses 16 are formed on portions of the trench sidewalls.

Furthermore, after the formation of the trench isolation regions, sometimes a sacrificial layer is formed on the surface of the substrate for protection purposes. In subsequent processes, the sacrificial layer will be removed similar to the removal of the pad oxide layer using hydrofluoric acid solution. Thus, the same problem of recess formation in the oxide layer next to the substrate surface recurs due to over-etching.

When the processes necessary for the manufacturing of semiconductor devices are finished, the recesses left behind on the oxide layer will tend to attract and accumulate charges. This has the effect of lowering the device threshold voltage and generates abnormal sub-threshold current. Such phenomenon is known as the "kink effect". The lowering of device threshold voltage and the generation of abnormal sub-threshold current will lead to a worsening of device quality and a lowering of the production yield. In addition, corner parasitic MOSFET will be formed in parallel with the active device, thereby leading to the occurrence of leakage current from the device. Hence, the outcome from this semiconductor manufacturing process is not too desirable.

In light of the foregoing, there is a need in the art to provide a better structure and manufacturing method for shallow trench isolation.

SUMMARY OF THE INVENTION

Accordingly, the present invention is directed to provide a method for forming a shallow trench isolation structure that has a thicker oxide layer at the junction between the trench oxide and the substrate surface. A thicker oxide layer prevents the over-etching of the oxide layer during subsequent etching operations. Consequently, the kink effect generated by a conventional technique of production is reduced, and the severity of current leakage in devices caused by sub-threshold current and parasitic devices is greatly lowered. Hence, the overall functionality of the devices is raised.

To achieve these and other advantages and in accordance with the purpose of the invention, as embodied and broadly described herein, the invention provides a method for forming a shallow trench isolation structure. The method comprises the steps of sequentially forming a pad oxide layer and a mask layer over a substrate, then patterning the mask layer and the pad oxide layer. Next, an opening is formed in the mask layer, wherein the sidewall of the opening in the mask layer forms a sharp angle with the substrate layer below. Thereafter, the substrate is etched from the opening down to form a trench. In a subsequent step, the trench is filled by an insulating layer to a level higher than the mask layer. Because the sidewall of the mask layer forms an angle with the substrate layer, a portion along the upper side of the insulating layer has a protuberance. Subsequently, the mask layer is removed. Then, a portion of the pad oxide layer is removed using a dry etching method and forming a spacer on the side of the insulating layer. Finally, the pad oxide layer above the substrate is removed to complete the formation of the shallow trench isolation structure. Due to the presence of a spacer, power to resist subsequent etching is increased at the junction between the trench insulating layer and the substrate layer. Thus, the over-etching of the insulating layer in subsequent etching operations is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
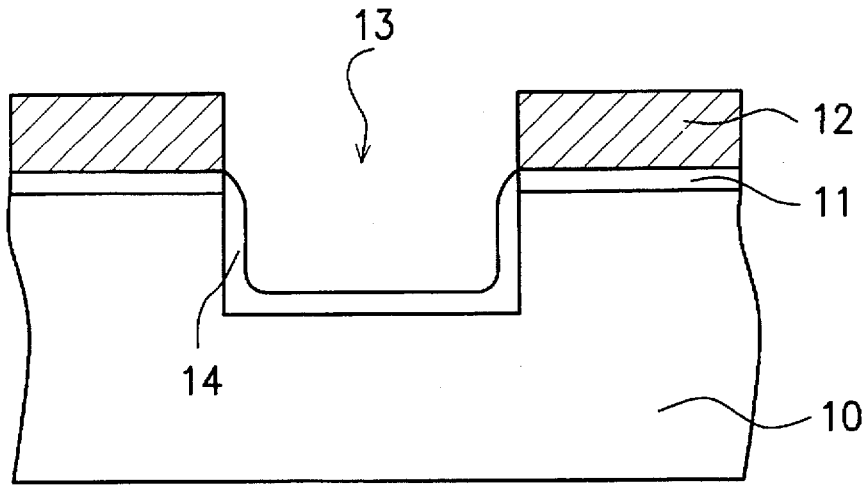
FIGS. 1A through 1C are cross-sectional views showing the progression of manufacturing steps in the production of a conventional shallow trench isolation structure.
Figure 1B:
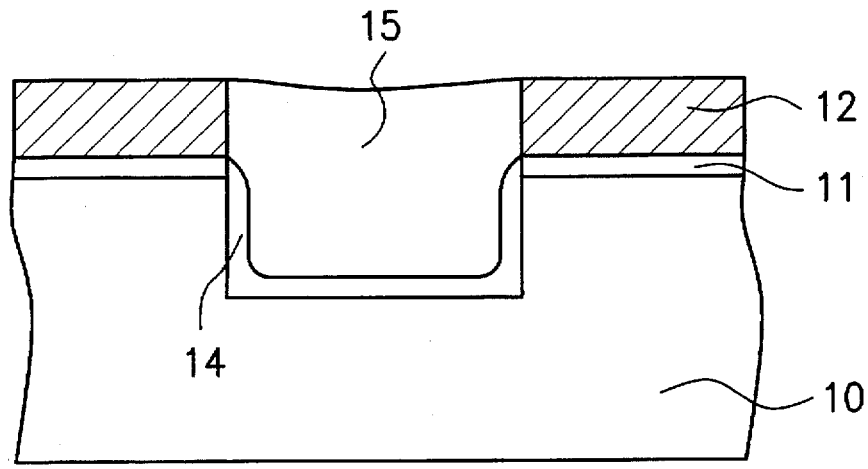
Figure 1C:
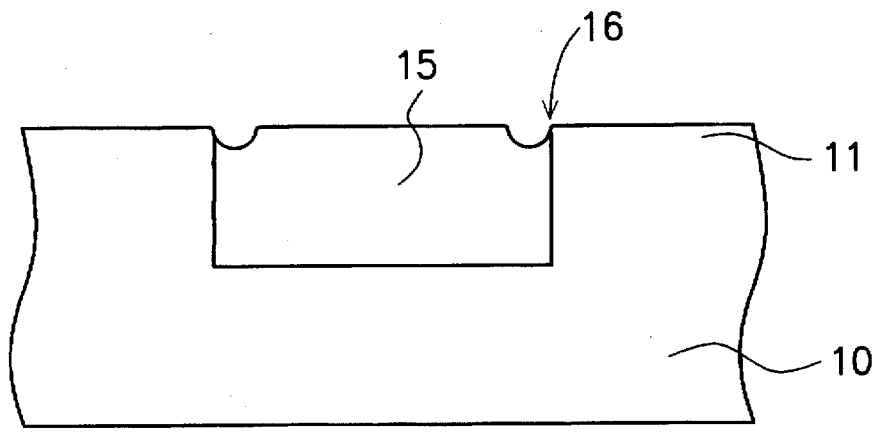

Reference will now be made in detail to the present preferred embodiments of the invention, examples of which are illustrated in the accompanying drawings. Wherever possible, the same reference numbers are used in the drawings and the description to refer to the same or like parts.

Figure 2A:
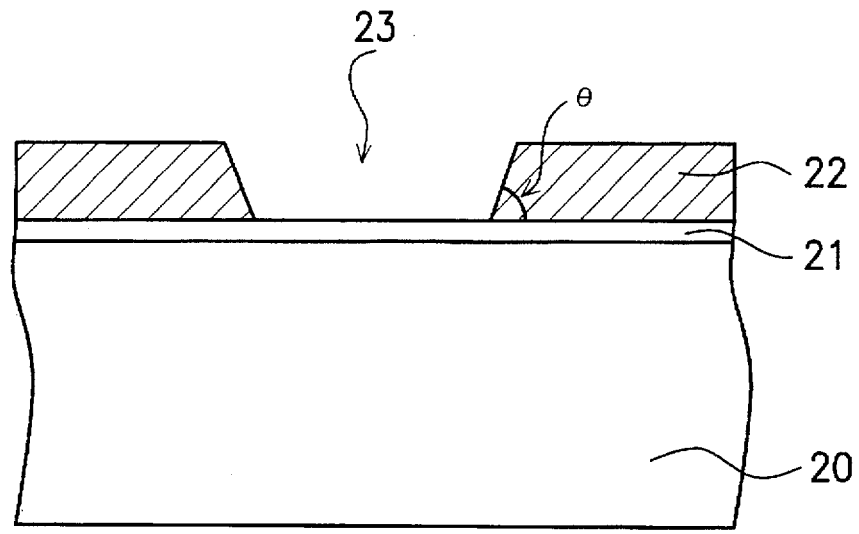
FIGS. 2A through 2F are cross-sectional views showing the progression of manufacturing steps in the production of a shallow trench isolation structure according to one preferred embodiment of this invention.

FIGS. 2A through 2F are cross-sectional views showing the progression of manufacturing steps in the production of a shallow trench isolation structure according to one preferred embodiment of this invention. First, as shown in FIG. 2A, a pad oxide layer 21 is formed over a substrate 20. The pad oxide layer 21 is formed using a thermal oxidation method, and preferably has a deposited thickness of about 200 Å to 500 Å. Then, a mask layer 22 is formed over the pad oxide layer 21 using a chemical vapor deposition (CVD) method. The mask layer 22 can be formed by depositing silicon nitride, for example.

Thereafter, using photolithographic techniques, the mask layer 22 is etched to form an opening 23 exposing portions of the pad oxide layer 21. Etching of the mask layer is carried out using an anisotropic dry etching method, for example, a plasma etching method. If the mask layer is a silicon nitride layer, then a suitable gaseous etching mixture including sulfur hexafluoride ($SF_6$), gaseous helium and oxygen is employed. After the etching operation, the opening 23 in the mask layer 22 has a tapering cross-section. Furthermore, the sidewall of the opening forms a sharp angle θ with the substrate layer. The angle θ is preferably between 60° to 90°.

Figure 2B:
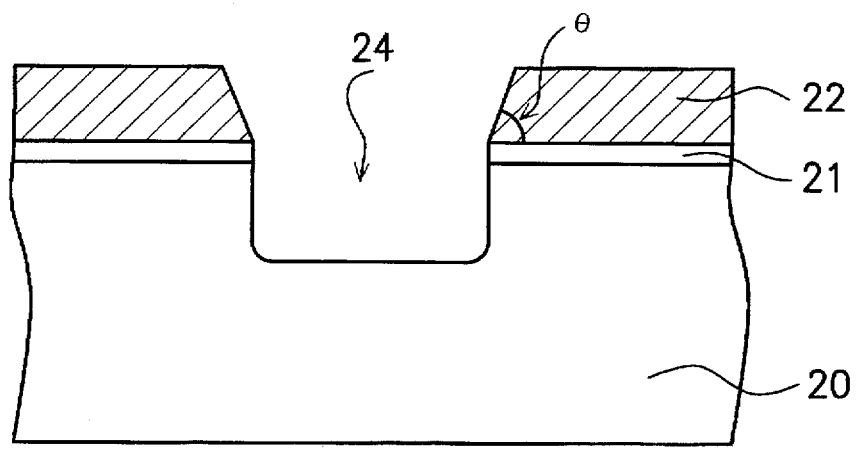

Next, as shown in FIG. 2B, the pad oxide layer 22 exposed by the opening 23 is etched away, and then the substrate 20 exposed by the same opening 23 is etched to form a trench 24. The etching can be carried out, for example, using a dry etching method or a reactive ion etching (RIE) method. When a RIE method is used, the pad oxide layer 21 can be etched using a gaseous mixture including carbon trifluoromethane ($CHF_3$), gaseous oxygen and argon, and the substrate 20 can be etched using a gaseous mixture including gaseous chlorine, helium, hydrogen bromide and oxygen. If the bottom part of the trench is etched using gaseous substances such as sulfur hexafluoride ($SF_6$) or helium-oxygen (He—$O_2$) mixture, the lower trench will have more rounded corners.

Figure 2C:
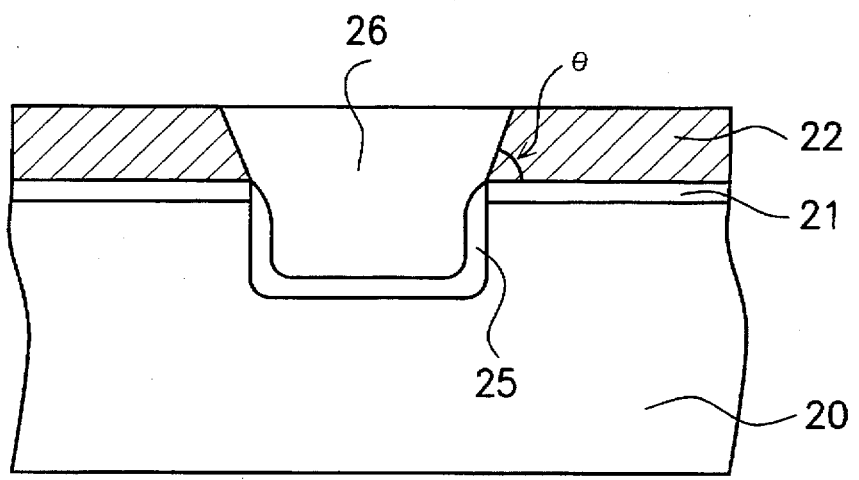

Next, as shown in FIG. 2C, a liner oxide layer 25 is formed on the substrate in the interior surface of the trench 24, for example, using a thermal oxidation method. Thereafter, a thick insulating layer is formed completely covering the trench 24 and extending over to the mask layer 22. Subsequently, the insulating layer is etched back to form an insulating layer 26 that completely fills the trench 24 and at a level not lower than the mask layer 22.

The insulating material can be an oxide formed using a chemical vapor deposition (CVD) method with ozone-TEOS (tetraethyl orthosilicate) or TEOS as the reactive gases. This is then followed by a subsequent densification process, for example. Alternately, the insulating layer can be formed using a high-density plasma chemical vapor deposition (HDPCVD) method. A HDPCVD method can produce an insulating oxide layer having a higher density and a better quality than an ordinary CVD process with a subsequent densification. A chemical-mechanical polishing (CMP) method can be used to etch back the insulating layer, and that the mask layer 22 can serve as a polishing stop layer in the CMP operation.

Figure 2D:
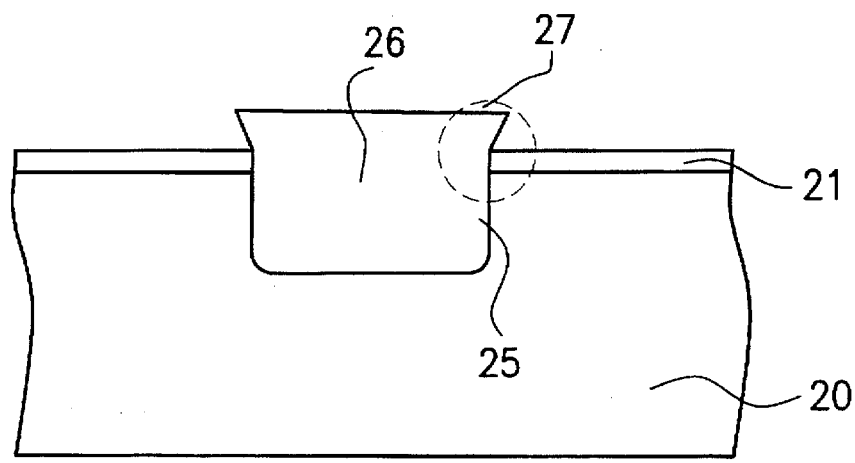

Next, as shown in FIG. 2D, the mask layer 22 is removed. If the mask layer 22 is a silicon nitride layer, a wet etching method using hot phosphoric acid solution can be employed for its removal. After the removal of the mask layer 22, the upper surface of the insulating layer 26 will be at a higher level than the pad oxide layer 21. Furthermore, because there is a sharp angle at the side of the original opening in the mask layer, the subsequently deposited insulating layer 26 also forms an angle at the junction with the mask layer 22. Consequently, the upper portion of the insulating layer 26 has a protuberance 27 protruding out on each side with respect to the insulating layer buried inside the substrate.

Figure 3:
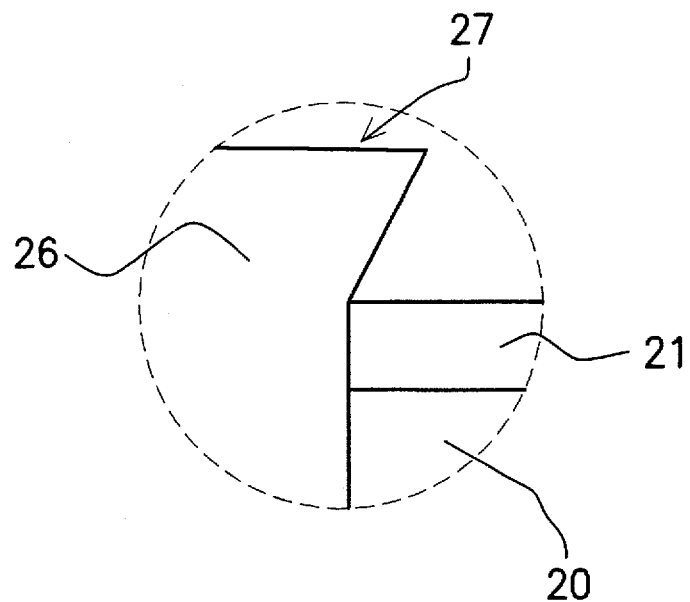
FIG. 3 is a magnified view of the region enclosed within the dash-circle in FIG. 2D.

FIG. 3 is a magnified view of the region enclosed within the dash-circle of FIG. 2D. As shown in FIG. 3, the upper side of the insulating layer 26 above the substrate surface level has an overhanging protuberance with respect to the side of the insulating layer that lies below the substrate level.

Figure 2E:
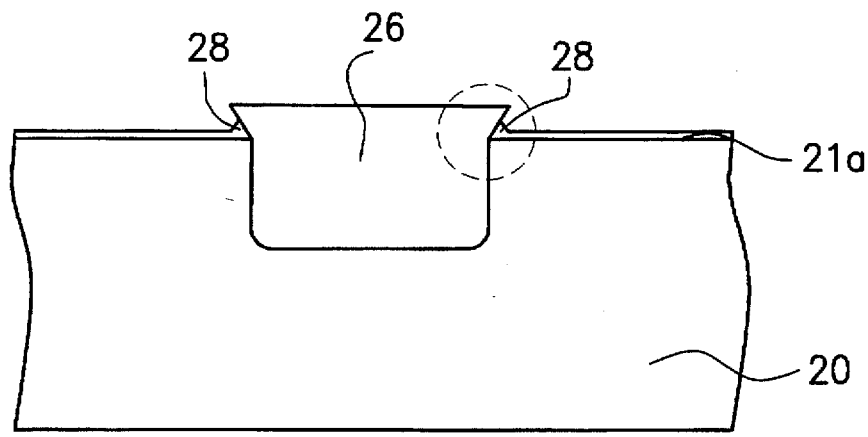

Next, as shown in FIG. 2E, portions of the pad oxide layer 21 is removed to form a thin pad oxide layer 21a using a dry etching method, for example. Since the insulating layer 26 above the substrate surface level protruded more than the insulating layer 26 buried within the substrate, the protuberance 27 at the side of the insulating layer forms a resistive barrier against the anisotropic etch removal of the pad oxide layer 21. Hence, a spacer 28 is formed between the pad oxide layer 21a and the protuberance 27 at the side of the insulating layer 26.

Figure 4:
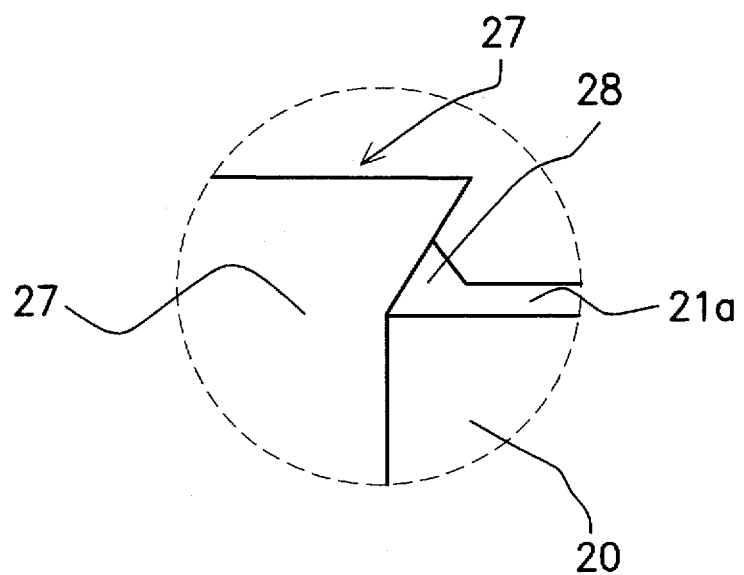
FIG. 4 is a magnified view of the region enclosed within the dash-circle in FIG. 2E.

FIG. 4 is a magnified view of the region enclosed within the dash-circle in FIG. 2E. From FIG. 4, the spacer 28 formed between the pad oxide layer 21a and the protuberance 27 at the side of the insulating layer 26 is clearly seen.

Figure 2F:
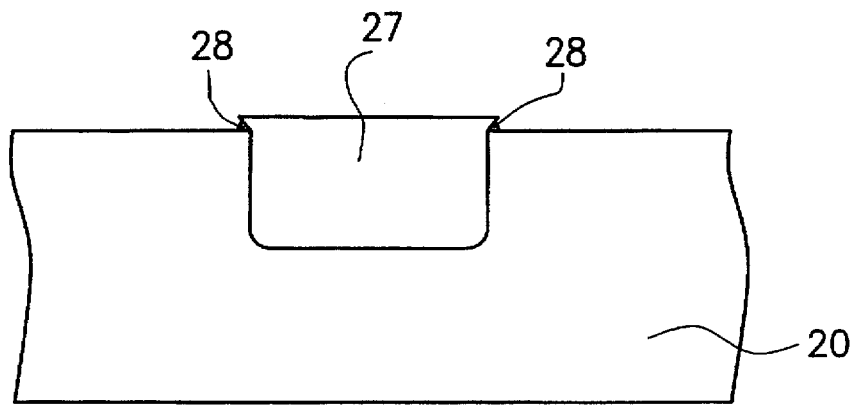

Finally, the pad oxide layer 21a above the substrate is removed, for example, using hydrofluoric acid solution in a wet etching process, and forming the complete shallow trench isolation structure as shown in FIG. 2F. Due to the formation of the spacer 28 at the junction between neighboring trench and substrate surface, a thicker insulating layer at the upper surface is obtained. Thereafter, other conventional processes necessary for the complete formation of the devices in the integrated circuit is performed.

The method of this invention utilizes the angle formed between the opening in the mask layer and the substrate surface to produce a protuberance at the upper side of the insulating layer. Then, a dry etching method is used to remove portions of the pad oxide layer so that a spacer is formed between the protuberance and the pad oxide layer. Consequently, a thick oxide layer is formed at the junction between neighboring trench insulating layer and the substrate surface. A thick oxide layer is capable of preventing the over-etching of the insulating layer in subsequent etching processes. Hence, kink effect and other adverse effects such as sub-threshold current and parasitic transistor due to recesses leading to current leakage problem in the device are greatly reduced. Therefore, the overall functionality of the device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claim is:

1. A method for manufacturing shallow trench isolation structure comprising the steps of:

providing a substrate;

forming a pad oxide layer and a mask layer above the substrate;

patterning the mask layer and the pad oxide layer and etching to form an opening in the mask layer, wherein the sidewall of the mask layer forms an angle with the pad oxide layer;

etching the pad oxide layer and the substrate through the opening to form a trench;

depositing an insulating material into the trench to form an insulating layer, wherein the top surface of the insulating layer is at a higher level than the mask layer and has a protuberance attached to a side;

removing the masking layer;

removing portions of the pad oxide layer to form a spacer next to the sidewall of the insulating layer; and removing the pad oxide layer above the substrate.

2. The method of claim 1, wherein after the step of forming the trench and before depositing the insulating material into the trench, further includes forming a liner oxide layer on the interior surface of the trench.

3. The method of claim 2, wherein the step of forming the liner oxide layer includes using a thermal oxidation method.

4. The method of claim 1, wherein the step of forming the mask layer includes depositing silicon nitride.

5. The method of claim 1, wherein the step of etching the mask layer includes using a dry etching method.

6. The method of claim 1, wherein the step of forming the opening includes etching a sharp angle between the sidewall of the mask layer and the pad oxide layer.

7. The method of claim 6, wherein the angle is preferably in the range between 65° to 90°.

8. The method of claim 1, wherein the step of depositing insulating material into the trench further includes forming an insulating layer over the mask layer and etching back the insulating layer.

9. The method of claim 8, wherein the step of etching back the insulating layer includes using a chemical-mechanical polishing operation.

10. The method of claim 9, wherein the step of chemical-mechanical polishing includes using the mask layer as a polishing stop layer.

11. The method of claim 8, wherein the step of depositing insulating material includes depositing an oxide material.

12. The method of claim 1, wherein the step of removing the mask layer includes using hot phosphoric acid in a wet etching process.

13. The method of claim 1, wherein the step of removing portions of the pad oxide layer includes using a dry etching method.

14. The method of claim 1, wherein the protuberance in the insulating layer serves as a resistive barrier against etching during the etch removal of portions of the pad oxide layer.

15. The method of claim 1, wherein the step of removing the pad oxide layer from the substrate includes using hydrofluoric acid solution in a wet etching process.

* * * * *